(12) United States Patent
Vollersten

(10) Patent No.: US 6,806,720 B2
(45) Date of Patent: Oct. 19, 2004

(54) METHOD OF RELIABILITY TESTING

(75) Inventor: Rolf-P. Vollersten, Ebersberg (DE)

(73) Assignee: Infineon Technologies Aktiengesellschaft, Munich (DE)

(*) Notice: Subject to any disclaimer, the term of this patent is extended or adjusted under 35 U.S.C. 154(b) by 33 days.

(21) Appl. No.: 10/065,920

(22) Filed: Nov. 29, 2002

(65) Prior Publication Data

US 2004/0104731 A1 Jun. 3, 2004

(51) Int. Cl.[7] ........................ G01R 27/08; G01R 31/26
(52) U.S. Cl. ................... 324/551; 324/711; 324/765
(58) Field of Search .................. 324/551, 554, 324/522, 523, 525, 452, 711, 719, 722, 760, 765; 703/14, 4

(56) References Cited

U.S. PATENT DOCUMENTS

| | | | | |
|---|---|---|---|---|
| 4,904,946 A | * | 2/1990 | Hirai | 324/551 |
| 5,150,059 A | * | 9/1992 | Bognar et al. | 324/551 |
| 5,594,349 A | * | 1/1997 | Kimura | 324/551 |
| 5,949,694 A | * | 9/1999 | Amerasekera et al. | 716/5 |
| 6,326,800 B1 | * | 12/2001 | Kirihata | 324/760 |

OTHER PUBLICATIONS

Satake, H.; Toriumi, A; (Dielectric breakdown mechanism of thin–SiO2 studied by the post–breakdown resistance statistics. Electric Devices, IEEE Transactions on, vol.:47, Issue: 4 , Apr. 2000 pp.: 741–745).*

Takeda, K–I.; Hinoda, K.; Oodake, I.; Oohashi, N.; Yamaguchi, H.; (Enhanced dielectric breakdown lifetime of the copper/silicon nitride/silicon dioxide structure. Reliability Physics Symposium Proceedings, 1998. 36th Annual. IEEE 98CH36173, pp. 36–41.*

J. H. Stathis; "Reliability limits for the gate insulator in CMOS Technology"; IBM J. Res. & Dev. vol. 46 No. 2/3; Mar./May 2002; pp. 265–286.

E. Y. Wu, E. J. Nowak, A. Vayshenker, W. L. Lai, D. L. Harmon; "CMOS Scaling Beyond the 100–nm Node with Silicon–Dioxide–Based Gate Dielectrics"; IBM J. Res. & Dev. vol. 46 No. 2/3; Mar./May 2002; pp. 287–298.

Kin P. Cheung, Thin gate–oxide Reliability–The Current Status; Symposium on Nano Device Tech 2001, Taiwan; Apr. 2001.

B. Kaczer, R. DeGraeve, G. Groeseneken, M. Rasras, S. Kubicek, E. Vandamme, G. Badenes; "Impact of MOSFET Oxide Breakdown on Digital Circuit Operation and Reliabilty"; IEDM Tech Digest 2000; pp. 553–556.

Barry P. Linder, David J. Frank, Kames H. Stathis, Stephan A. Cohen; "Transistor–Limited Constant Voltage Stress of Gate Dielectrics"; 2001 Symposium on VLSI Technology Digest of Technical Papers 2001.

* cited by examiner

*Primary Examiner*—Anjan K. Deb
(74) *Attorney, Agent, or Firm*—Slater & Matsil, L.L.P.

(57) ABSTRACT

A method of reliability testing is disclosed. A critical breakdown resistance of a device is determined. The test structure is subjected to stress conditions and electrically tested. The critical breakdown time of the test structure is recorded when the operating resistance of the test structure is equal or smaller than the critical breakdown resistance.

38 Claims, 4 Drawing Sheets

METHOD OF RELIABILITY TESTING

BACKGROUND OF INVENTION

Reliability testing is carried out to ensure that products are properly designed and assembled by subjecting test structures to stress conditions that accelerate potential failure mechanisms. Failure may be caused by the degradation of a dielectric layer on a semiconducting or conducting substrate in, for example, Metal Oxide (MOS) integrated circuits (ICs). The aggressive scaling of the thickness of the dielectric layer has caused the reliability of increasingly thinner dielectrics to assume greater importance in the reliability testing of semiconductor ICs.

The degradation of the dielectric layer over time causes it to lose its insulating properties, leading to increases in leakage current that may limit the lifetime of the device. Long-term failure rates are often predicted based on determining the critical breakdown time of the dielectric layer. Referring to FIG. 1, a reliability test is carried out by subjecting a dielectric layer to highly accelerated stress conditions, such as high temperatures or voltages. The leakage current is continuously measured until the first current increase after, for example, time $t_0$. This current increase may be relatively small as shown in FIG. 1 or could be a large increase that reaches compliance of the power supply. In the first case, which is mostly found in dielectrics thinner than 5.5 nm, the dielectric layer may experience subsequent breakdowns after $t_0$, which leads to further increases in current. The criterion for determining the critical breakdown time is the first onset of a current increase at time $t_0$.

However, the critical breakdown time of the dielectric layer thus defined does not necessarily cause the circuit or device to be inoperable or lose its functionality. For example, it has been observed that a ring oscillator circuit continues to operate even after a number of its transistors have undergone a hard gate-oxide breakdown in B. Kaczer et al, "Impact of MOSFET oxide breakdown on digital circuit operation and reliability", IEDM Tech. Digest, pp.553–556 (2000), which is herein incorporated by reference for all purposes.

The magnitude of the current (e.g. $I_m$) after the dielectric breakdown may not be large enough to cause failure. The magnitude of the leakage current is affected by the circuit environment of the device which includes, for example, the drive current or the capacitative loading of the circuit. The tolerance for current increases varies considerably for different circuits and some circuits are less sensitive to the erosion of noise and voltage margins than others. The lifetime projection based on this criterion tends to be very conservative, as it does not take into account the circuit environment of the device in specific applications.

Hence, as evident from the foregoing discussion, it is desirable to provide a method of reliability testing that is more accurate and relevant to the IC application.

SUMMARY OF INVENTION

The present invention relates to a method of reliability testing. In accordance with the invention, a critical breakdown resistance of a device is determined, wherein the critical breakdown resistance causes a circuit to fail. The test structure is then subjected to stress conditions. The operating resistance of the test structure is determined repetitively. A critical breakdown time is recorded when the operating resistance is equal or less than the critical breakdown resistance. The reliability of the device is determined from the critical breakdown time.

DETAILED DESCRIPTION

The invention relates to the reliability testing of semiconductor ICs and components thereof. In accordance with the invention, the method of reliability takes into account the overall design of the circuit to predict the time of failure. The effect of current leakage caused by the breakdown in the dielectric is dependent on the circuit design, as discussed previously. The device may still have a high resistance value after the first breakdown of the dielectric, which will not cause immediate failure of the circuit. In accordance with the invention, the reliability of the device is characterized by a critical breakdown resistance which causes the circuit to fail or lose its functionality.

The reliability of the device is determined by subjecting test structures to highly accelerated stress conditions. The test structure comprises a semiconducting or conducting substrate and a dielectric layer formed on the substrate. In one embodiment, the substrate comprises metal or silicon. Other types of substrates are also useful. In one embodiment, the dielectric layer comprises an oxide layer. In another embodiment, the dielectric layer comprises oxide-nitride-oxide (ONO) or nitride-oxide (NO). Other types of dielectric layers are also useful. In one embodiment, the test structure includes the actual device or devices (e.g., transistors or capacitors). In another embodiment, the test structure comprises capacitor structures that have about the same dielectric thickness as the actual device. Such capacitor structures may comprise different shapes (e.g., square, rectangle, circle or comb-like), edge types, edge lengths or areas. This invention also applies to other types of test structures. In one embodiment, the test structure is formed adjacent to the actual device on the same chip.

Figure 1:
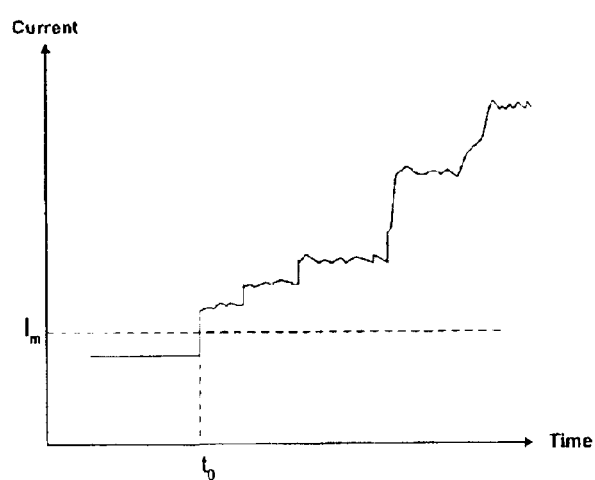
FIG. 1 shows a graph depicting the change in current over time of a dielectric layer subjected to accelerated stress conditions and the conventional determination of the critical breakdown time.
Figure 2:
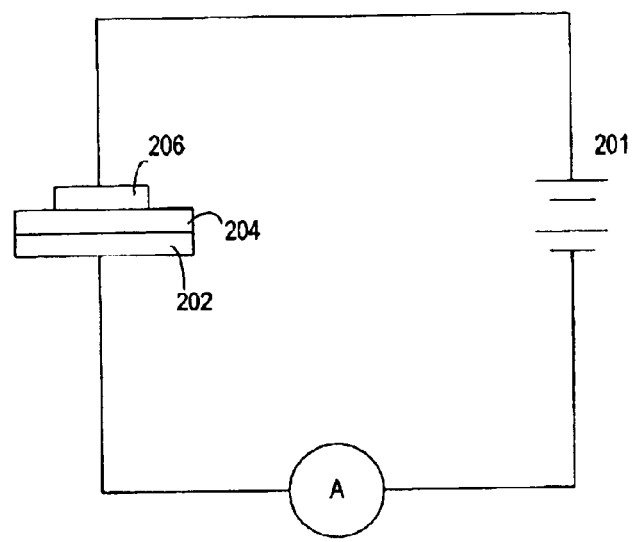
FIG. 2 shows a test structure undergoing testing in accordance with one embodiment of the invention.

FIG. 2 shows a test structure undergoing testing in one embodiment of the invention. The test structure is coupled to a voltage source 201, which provides the stress voltage that accelerates the breakdown of the test structure. The test structure comprises a dielectric layer 204 grown on a substrate 202. The test structure comprises, for example, a layer of oxide (e.g., silicon oxide) grown on a silicon substrate. In one embodiment, a gate electrode 206 is formed on the oxide layer. The thickness of the dielectric layer is, for example, less than about 3.4 nm. The area of the test structure (e.g., capacitor) is typically about 0.01 mm$^2$ or smaller. Other types of test structures with other areas are also useful. In one embodiment, the current through the test structure is monitored during the testing to detect a significant increase in current, which may indicate a dielectric breakdown.

Figure 3:
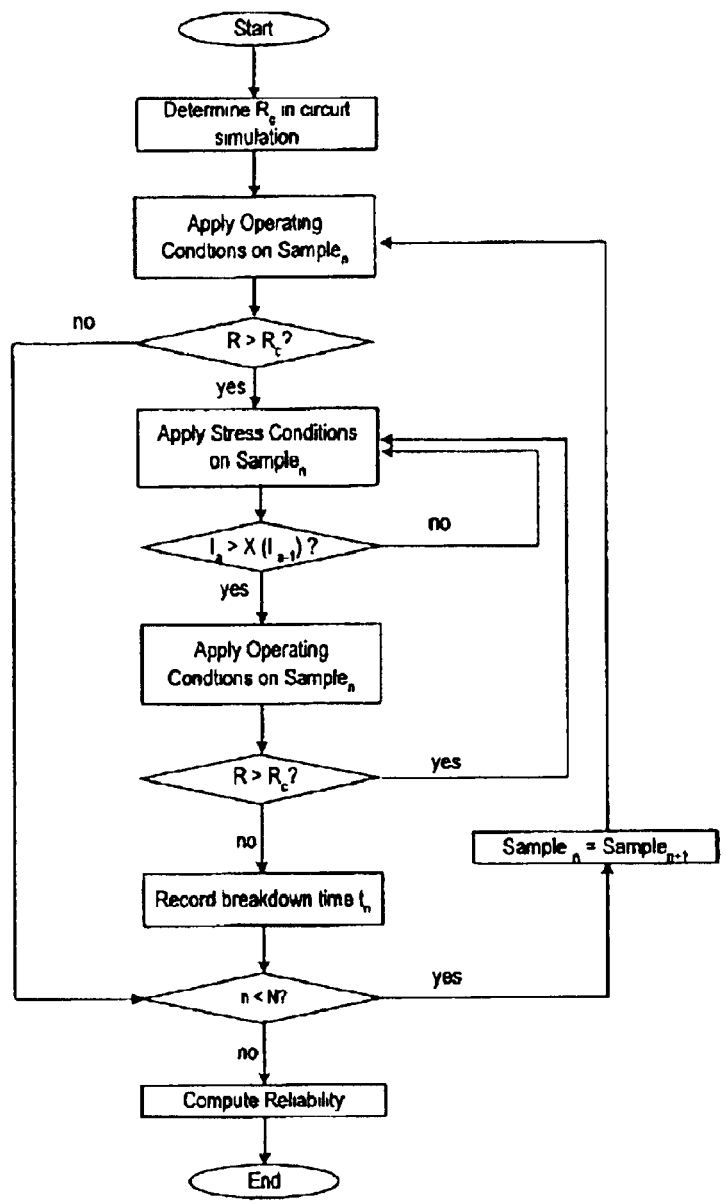
FIG. 3 shows a flowchart of the test method in accordance with one embodiment of the invention.

FIG. 3 shows a flowchart of the test method, in accordance with one embodiment of the invention. The reliability of the device is characterized by its critical breakdown resistance $R_c$ which causes the circuit to fail or lose its functionality. In one embodiment, the critical breakdown resistance $R_c$ of the device is determined by varying the resistance of the device in the actual circuit environment under normal operating conditions until the circuit fails. In one embodiment, the critical breakdown resistance is obtained through circuit simulation of the actual application. Circuit simulation tools such as HSPICE may be used to simulate the circuit. The critical breakdown resistance coincides with the minimum shunt resistance that is required before the performance of the circuit is degraded beyond its specifications. Depending on the circuit environment, the critical breakdown resistance that causes the circuit to fail can be, for example, in the range of 1 kΩ to 100 kΩ. Other critical breakdown resistance values can also be useful in accordance with different design requirements.

For example, the circuit environment comprises a word line driver circuit that is used to internally drive word lines in memory ICs. This invention also applies to other types of circuit environment. If the devices (e.g., transistors) in the circuit experience breakdowns, the voltage and current at the word line will deviate from their normal values during operation. However, the resistances of the devices may still be high enough to prevent a substantial deviation in voltage or current, and the circuit may still be functional after the first breakdown or subsequent multiple breakdowns. The tolerance for deviation depends on the sensitivity of the circuit, and may range from 5% to 30%. Other tolerance values can also be useful, depending on different design requirements. The circuit loses its functionality when the shunt resistance drops a critical breakdown resistance. In one embodiment, the critical breakdown resistances of all the critical devices in the circuit operating under normal conditions are determined using circuit simulation.

In one embodiment, the operating resistance R of the nth sample of the test structure (Sample$_n$) is determined under normal operating conditions, wherein n is an integer less than a predefined number of samples N. If the operating resistance R is less than or equal to the critical breakdown resistance $R_c$, the test is terminated. If the operating resistance is more than the critical resistance, the test structure is subjected to highly accelerated stress conditions. In one embodiment, the stress conditions comprise elevated voltages, currents or temperatures, or a combination thereof. Other types of stress conditions are also useful. In one embodiment, the stress conditions comprise elevated voltages that are about twice the operating voltage. The test structure is subjected to stress for a duration of, for example, 50 to 10000 seconds. Subjecting the test structure to stress for other periods of time is also useful.

The operating resistance of the test structure under normal operating conditions is repetitively determined after subjecting the test structure to stress. In one embodiment, the operating resistance is determined after a significant change is detected in at least one electrical property of the test structure. In one embodiment, the electrical property comprises current or voltage. Other electrical properties may also be monitored. For example, if a stress voltage is applied, the current $I_a$ is monitored until it is greater than $X(I_{a-1})$, wherein $I_a$ represents the current measurement at time a, $I_{a-1}$ represents the previous current measurement at time (a-1) and X represents the sensitivity factor, $X \geq 1$. The sensitivity factor X is preferably predefined according to the circuit design.

Alternatively, the operating resistance (not shown) is determined after a time interval (e.g., 100 seconds). Providing time intervals of other duration is also useful. The time interval can be predefined according to the stress duration. The time interval is preferably small relative to the breakdown time to avoid significant error. In one embodiment, the time interval changes with the stress duration. For example, the time interval can be defined as a fraction (e.g., 1/100) of the expected stress duration. In one embodiment, a time interval or a change in electrical properties is used to trigger the determination of operating resistance.

If the operating resistance R is less than or equal to the critical resistance $R_c$, the critical breakdown time $t_n$ is recorded. In one embodiment, the test procedure is repeated until a predetermined number N of test structure samples is subjected to the same stress and tested. The reliability of the device is then computed from the critical breakdown times of the test samples.

In one embodiment, the maximum current $I_c$ available after breakdown and the area of the test structure are provided. The maximum current can be estimated assuming ohmic behavior by Ohm's law using the stress voltage and the critical breakdown resistance $R_c$. In one embodiment, the area of the dielectric layer in the test structure is about the same as the dielectric layer in the actual device. Dielectric layers having areas different from the actual dielectric layer are also useful. A dielectric layer having a smaller area generally has a longer lifetime. A lifetime correction can be made from the test area to the actual area of the dielectric layer in the device using, for example, the Poisson area scaling.

Figure 4:
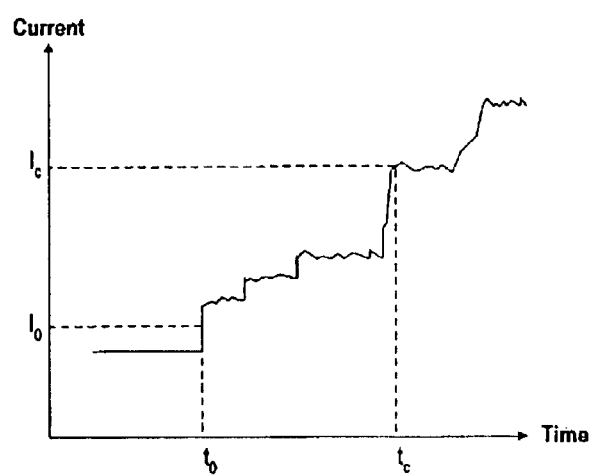
FIG. 4 shows a graph depicting the change in current over time of a dielectric layer subjected to accelerated stress conditions and the determination of the critical breakdown time in accordance with one embodiment of the invention.

As shown in FIG. 4, the critical breakdown time $t_c$ may occur only after a series of soft breakdowns following the initial breakdown at time $t_0$. Hence, the breakdown time thus defined is more relevant to the application, and allows for a more accurate lifetime projection.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of reliability testing comprising:
   providing a test structure;
   determining a critical breakdown resistance of the test structure, wherein the critical breakdown resistance of the test structure causes a circuit to fail;
   subjecting the test structure to stress conditions;
   repetitively determining an operating resistance of the test structure; and
   recording a critical breakdown time when the operating resistance of the test structure is equal or smaller than the critical breakdown resistance.

2. The method of claim 1 wherein the test structure comprises a substrate and a dielectric layer formed thereon.

3. The method of claim 2 wherein the dielectric layer comprises an oxide layer.

4. The method of claim 2 wherein the test structure comprises the actual device.

5. The method of claim 4 wherein the test structure comprises a transistor or capacitor.

6. The method of claim 2 wherein the test structure comprises a capacitor structure.

7. The method of claim 1 wherein the stress conditions comprise elevated voltages.

8. The method of claim 7 wherein an elevated voltage is about twice an operating voltage.

9. The method of claim 7 wherein the stress conditions comprise elevated temperatures or currents.

10. The method of claim 1 wherein the step of determining the critical breakdown resistance comprises determining the critical breakdown resistance in a circuit environment under normal operating conditions.

11. The method of claim 10 wherein the step of determining the critical breakdown resistance of the test structure comprises a circuit simulation.

12. The method of claim 1 wherein the step of determining the critical breakdown resistance of the test structure comprises a circuit simulation.

13. The method of claim 12 wherein the step of repetitively determining the operating resistance comprises determining the operating resistance after a significant change is detected in at least one electrical property.

14. The method of claim 13 wherein the electrical property comprises current or voltage.

15. The method of claim 13 further comprises repetitively determining the operating resistance after a time interval.

16. The method of claim 15 wherein the time interval is predefined according to a stress duration.

17. The method of claim 16 further comprising determining a maximum current after breakdown.

18. The method of claim 1 wherein the step of repetitively determining the operating resistance comprises repetitively determining the operating resistance after a significant change is detected in at least one electrical property.

19. The method of claim 18 wherein the electrical property comprises current or voltage.

20. The method of claim 19 further comprises repetitively determining the operating resistance after a time interval.

21. The method of claim 1 wherein the step of repetitively determining the operating resistance comprises repetitively determining the operating resistance after a time interval.

22. The method of claim 21 wherein the time interval is predefined according to a stress duration.

23. The method of claim 21 further comprising determining a maximum current after breakdown.

24. The method of claim 1 further comprising determining a maximum current after breakdown.

25. The method of claim 1 further comprising computing a reliability of the test structure from the critical breakdown time.

26. The method of claim 25 wherein the step of determining the critical breakdown resistance comprises determining the critical breakdown resistance in a circuit environment under normal operating conditions.

27. The method of claim 26 wherein the step of determining the critical breakdown resistance of the test structure comprises a circuit simulation.

28. The method of claim 27 wherein the step of repetitively determining the operating resistance comprises repetitively determining the operating resistance after a significant change is detected in at least one electrical property.

29. The method of claim 28 wherein the electrical property comprises current or voltage.

30. The method of claim 28 further comprises repetitively determining the operating resistance after a time interval.

31. A method of reliability testing, the method comprising:

providing a test structure;

determining a critical breakdown resistance of the test structure;

subjecting the test structure to stress conditions;

measuring an electrical characteristic of the test structure to determine an operating resistance of the test structure;

comparing the operating resistance of the test structure to the critical breakdown resistance;

repeating the subjecting, measuring and comparing steps until the operating resistance is less than or equal to the critical breakdown resistance; and recording a critical breakdown time when the operating resistance is less than or equal to the critical breakdown resistance.

32. The method of claim 31 wherein the critical breakdown resistance comprises by performing a circuit simulation.

33. The method of claim 31 wherein the test structure comprises a substrate and a dielectric layer formed thereon.

34. The method of claim 33 wherein the test structure comprises a capacitor structure.

35. The method of claim 31 wherein the stress conditions comprise elevated voltages.

36. The method of claim 34 wherein the stress conditions comprise elevated temperatures or currents.

37. The method of claim 31 wherein the step of determining the critical breakdown resistance comprises determining the critical breakdown resistance in a circuit environment under normal operating conditions.

38. The method of claim 31 further comprising computing a reliability of the test structure from the critical breakdown time.

* * * * *

UNITED STATES PATENT AND TRADEMARK OFFICE
CERTIFICATE OF CORRECTION

PATENT NO. : 6,806,720 B2
DATED : October 19, 2004
INVENTOR(S) : Vollertsen

It is certified that error appears in the above-identified patent and that said Letters Patent is hereby corrected as shown below:

Column 3,
Line 23, "environment" should read -- environments --;
Line 34, insert -- below -- after "drops";

Column 6,
Line 31, insert -- determining -- after "wherein";
Line 32, delete "by"

Signed and Sealed this

Twenty-ninth Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,806,720 B2
DATED : October 19, 2004
INVENTOR(S) : Vollertsen

It is certified that error appears in the above-identified patent and that said Letters Patent is hereby corrected as shown below:

Title page,
Item [75], Inventor, "Vollersten" should read -- Vollertsen --;

Signed and Sealed this

Thirty-first Day of May, 2005

JON W. DUDAS
*Director of the United States Patent and Trademark Office*